(12) United States Patent
Karna et al.

(10) Patent No.: US 9,018,734 B2
(45) Date of Patent: Apr. 28, 2015

(54) SINGLE WALL CARBON NANOTUBE DIODES

(75) Inventors: Shashi P. Karna, Hartford, MD (US); Mark Griep, Baltimore, MD (US); Govind Mallick, Bel Aire, MD (US)

(73) Assignee: The United States of America as represented by the Secretary of the Army, Washington, DC (US)

( * ) Notice: Subject to any disclaimer, the term of this patent is extended or adjusted under 35 U.S.C. 154(b) by 441 days.

(21) Appl. No.: 13/442,005

(22) Filed: Apr. 9, 2012

(65) Prior Publication Data

US 2012/0262965 A1  Oct. 18, 2012

Related U.S. Application Data

(60) Provisional application No. 61/475,920, filed on Apr. 15, 2011.

(51) Int. Cl.
| | |
|---|---|
| *H01L 29/93* | (2006.01) |
| *H01L 51/05* | (2006.01) |
| *B82Y 40/00* | (2011.01) |
| *B82Y 10/00* | (2011.01) |
| *H01L 51/00* | (2006.01) |

(52) U.S. Cl.
CPC .......... *H01L 51/0579* (2013.01); *B82Y 40/00* (2013.01); *B82Y 10/00* (2013.01); *H01L 51/0048* (2013.01)

(58) Field of Classification Search
CPC .... B82Y 10/00; B82Y 40/00; H01L 51/0579; H02M 7/06
USPC ........ 363/125, 126; 257/9, 594, 601, E29.002
See application file for complete search history.

(56) References Cited

U.S. PATENT DOCUMENTS

| | | | | |
|---|---|---|---|---|
| 7,563,711 | B1 * | 7/2009 | Ward et al. | 438/669 |
| 2008/0273280 | A1 * | 11/2008 | Chen et al. | 361/56 |

OTHER PUBLICATIONS

Lastella, S. et al.,"Density control of single-walled carbon nanotubes using patterned iron nanoparticle catalysts derived from phase separated thin films of a polyferrocene block copolymer," J.Mat. Chem., 2004, 14, 1791-1794.
Lastella, S et al., "Parallel arrays of individually addressable single-walled carbon nanotube field-effect transistors" J. Appl. Phys. 2006, 99, 024302 (1-4).
Mallick, G. et. al., "Alternating current-to-direct current power conversion by single-wall carbon nanotube diodes," Applied Physics Letters 96, 233109 (2010).

* cited by examiner

*Primary Examiner* — Matthew Nguyen
(74) *Attorney, Agent, or Firm* — Christos S. Kyriakou; Eric B. Compton

(57) ABSTRACT

Methods and devices relating to diodes including single-wall carbon nanotubes (SWCNT) are disclosed according to embodiments of the present invention. According to one embodiment, a diode may include one or more SWCNTs. The SWCNTs may be grouped together in multiple bundles with the SWCNTs being generally aligned parallel to each other in the bundles.

20 Claims, 4 Drawing Sheets

14μm x 4.5μm

SINGLE WALL CARBON NANOTUBE DIODES

CROSS-REFERENCE TO RELATED APPLICATION(S)

The application claims the benefit of U.S. Provisional Patent Application No. 61/475,920, filed Apr. 15, 2011, herein incorporated by reference in its entirety for all purposes.

GOVERNMENT INTEREST

Governmental Interest—The invention described herein may be manufactured, used and licensed by or for the U.S. Government.

This invention resulted from research that was supported by the US Army Research Laboratory, Director's Research Initiatives, ARL-DRI-07-WMR-10 and ARL-DRI-08-WMR-20.

FIELD OF INVENTION

Embodiments of the present invention generally relate to diodes, and in particular, to single-wall carbon nanotube diodes.

BACKGROUND OF THE INVENTION

Increasing demand for low power consumption in the electronics market combined with continued miniaturization of electronic device components in analogue or digital circuits has led to supply voltage being less than a volt (i.e., sub-volt levels) for many devices. The supply voltage to integrated circuit (IC) devices are typically provided by AC-DC power converters, which convert high frequency AC input voltage to a conditioned or rated DC output voltage at a given power level. Low-voltage AC-DC converters generally consist of a diode rectifier, which is often composed of several conventional semiconductor diodes, an inductor and capacitor.

Typical rectifier technology, however, is bulky and has lower power conversion efficiency. In addition, conventional power conversion diodes have problems with thermal conductivity, heat generation and manufacturing.

BRIEF SUMMARY OF THE INVENTION

Methods and devices relating to diodes including single-wall carbon nanotubes (SWCNT) are disclosed according to embodiments of the present invention.

According to one embodiment, a diode may include one or more SWCNTs. The SWCNTs may be grouped together in multiple bundles with the SWCNTs being generally aligned parallel to each other in the bundles. The length of the diode may be approximately 10-15 μm and the diameter of the diode may be approximately 1.5-4 nm.

According to another embodiment, a rectifier may include one or more of the aforementioned diodes. The one or more diodes may be configured for half-wave, a full-wave or a full-wave bridge rectification.

According to yet another embodiment, a power converter configured to convert alternating current (AC) to direct current (DC) may include one or more of the aforementioned diodes.

According to a further embodiment, a method of power conversion may include supplying an input to the aforementioned diode. The input may be 1-3 $V_{AC}$ with a frequency of about 1-1000 Hz.

According to still a further embodiment, a method for fabricating a diode may include: growing one or more SWCNTs on a substrate. Growing the SWCNTs may include using a catalytically chemical vapor deposition (CCVD) technique.

BRIEF DESCRIPTION OF THE DRAWINGS

So that the manner in which the above recited features of the present invention can be understood in detail, a more particular description of the invention, briefly summarized above, may be had by reference to embodiments, some of which are illustrated in the appended drawings. It is to be noted, however, that the appended drawings illustrate only a few embodiments of this invention and are therefore not to be considered limiting of its scope, for the invention may admit to other equally effective embodiments. These embodiments are intended to be included within the following description and protected by the accompanying claims.

FIG. 5($b$) shows a I-V curve and corresponding AC-DC half-wave power conversion. FIG. 5($c$) shows the I-V trace of a blank the substrate without the SWCNTs as a comparison. FIG. 5($d$) shows the corresponding experimental AC-to-DC half-wave conversion under multiple loads. FIG. 5($e$) is a plot of the conductance (dI/dV) of the I-V trace.

DETAILED DESCRIPTION OF THE INVENTION

Figure 1:
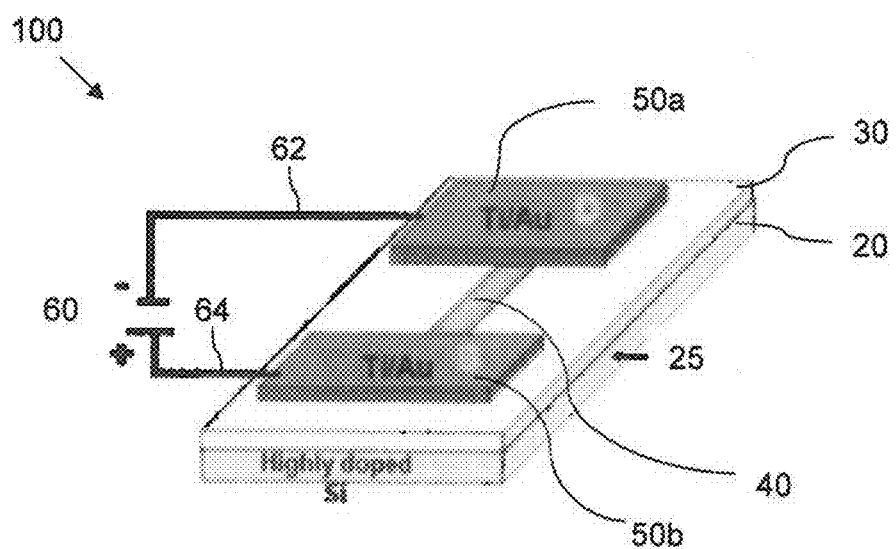
FIG. 1 is a schematic of a single-wall carbon nanotube (SWCNT) diode which was fabricated and tested by the inventors.

Carbon nanotubes have been identified by the inventors as a viable material for ultra-low power electronics. This technology can help bring component size down to the nanoscale size, i.e. orders of magnitude smaller than conventional electrical systems.

Solid state diodes that include one or more single-wall carbon nanotubes (SWCNTs) are disclosed herein according to embodiments of the present invention. Carbon nanotubes are allotropes of elemental carbon (C) with a cylindrical structure with a size on the nanometer ($10^{-9}$ m) level. Nanotubes have a very large length-to-diameter ratio. In diodes according to embodiments of the present invention, it has been observed that the SWCNTs are in bundles in some cases. More particularly, the SWCNTs may be grouped together in multiple bundles in the diode with the SWCNTs generally being aligned parallel to each other in the bundles. It is believed that the diode-like property of the SWNCT bundles most likely results from the structural defects on the SWCNT walls and/or the presence of tubes with mixed chirality in the bundles. The channel length or the number of nanotubes appears to have little to no effect on the rectification behavior.

The SWCNTs may be grown on a substrate using a catalytically chemical vapor deposition (CCVD) technique. For example, growth of the SWCNT diodes may be performed according to the methods disclosed in Lastella, S et al., "Parallel arrays of individually addressable single-walled carbon nanotube field-effect transistors" *J. Appl. Phys.* 2006, 99, 024302 (1-4), and Lastella, S. et al., "Density control of single-walled carbon nanotubes using patterned iron nanoparticle catalysts derived from phase separated thin films of a polyferrocene block copolymer," *J. Mat. Chem.*, 2004, 14, 1791-1794, the disclosures of which are herein incorporated by reference in their entireties. SWCNT growth density and bundle diameter can be controlled by varying the process parameters according to the latter aforementioned publication. Of course, other techniques for growing the SWCNT diodes may also be used. For more efficient large-scale manufacturing, an array of diodes may be fabricated on the substrate. The substrate can then be diced to separate individual diodes.

Before the SWCNTs are grown on the substrate, a thin layer of a thermal insulator or an oxide may be first deposited onto the substrate. The layer may be silicon dioxide ($SiO_2$) or other insulator having a thickness of approximately 100 nm, for example. It may be deposited using any suitable technique, such a chemical vapor deposition (CVD) or physical vapor deposition (PVD) technique. Next, a thin layer of a precursor film may optionally be applied (e.g., by spin-casting) to the substrate to promote SWCNT growth. One precursor film which may be used, for example, is amorphous asymmetric PS-b-PFEMS (polystyrene-b-polyferrocenylethylmethylsilane) block copolymer having a thickness ranging from 25-100 nm, as discussed in the former aforementioned publication. The film thickness may be used to control the nanotube bundle diameter, growth density and/or nanotube diameters. For instance, it has been found that as the thickness of the film increased the bundle diameter increased while growth density decreased. And, as the thickness of the film increases so did the nanotube diameters.

As mentioned above, the SWCNTs may be grown using a CCVD technique, for example. Using this process, highly dispersed, long stands (e.g., averaging 10 μm in length) of nearly-defect-free single tube or thin uniform bundles having diameters of about 1.5-4 nm of pure SWCNT may be produced. The SWCNT density may be changed by controlling the polymer film thickness to create three to six tube bundles per 100 $μm^2$, which provide a high density of separated and relatively disentangled tubes. For a 7.5 μm gap diode, for instance, it is believed that there may be approximately 375 to 750 nanotube bundles.

After the SWCNTs have been fabricated on the substrate, the substrate may be optionally annealed to help improve electrode/nanotube interfaces and remove any process-induced oxide defects. In one embodiment, the substrate may be heated to approximately 200° C. for about 30 minutes in an inert atmosphere. For instance, during annealing, a constant flow of nitrogen may be supplied to the substrate.

The fabricated diodes may have a generally cylindrical shape; although other shapes and configurations are possible. For instance, the length of the diode may be approximately 10-15 μm and the diameter of the diode may be approximately 1.5-4 nm.

The diodes may be used in various analogue or digital circuits. In some embodiments, the diodes may be fabricated within an integrated circuit (IC), electronics module, or chip. Diodes may also be fabricated directly in or on a printed circuit board (PCB) or other electronics platform. In addition, the SWCNT diodes can also be configured as switching elements in circuits and electronic devices in which forward bias permits current to pass in an ON state and reverse bias does not enable current to pass in an OFF state.

Power conversion may also be desired for many applications. Thus, one or more diodes according the embodiments of the invention may be incorporated into power convertors and rectifiers. These may include power supplies or power cords having power convertors for computers, electronic devices, appliances or equipment, for example.

In particular, the diode may be used for power rectification, such as converting alternating current (AC) to direct-current (DC) in some embodiments. The power may be received from a power source including the power grid or another AC power source (such as a generator). Wind and tidal energy might also be harvested to provide AC power. In some embodiments, the AC power may be received wirelessly. For instance, many devices, such as radio-frequency identification (RFID) chips, biomedical implants, and wireless sensors, receive energy which is transmitted to it wirelessly, usually as an AC power signal, and the on-board electronics convert to DC power signal.

A pair of electrode pads may be provided for electrically connecting the diode to a power source; one pad at the source and the other pad at the drain of the diode. Suitable wiring may be soldered to electrode pads. Alternatively or additionally, suitable wiring traces formed in the substrate could connect to the electrode pads. Individual, long low defect SWCNT bundles form direct contacts with the electrode pads without a bridging tube network. In one embodiment, the surface area of one or both of electrode pads may be about 250×250 $μm^2$. The electrode pads may be formed by depositing one or more layers of conductive material by a suitable metal electrode deposition technique, such as CVD or PVD. In one embodiment, the pads may be formed by first depositing a layer of approximately 10 nm of titanium (Ti) onto the substrate followed by depositing a layer of approximately 100 nm of gold (Au) onto the deposited Ti layer.

One feature of the AC-DC SWCNT diode power converter is its high rectification, which allows large current to flow only in one direction or for one phase of the AC input. In some embodiments, the forward/reverse current ratio of the diode is on the order of $10^5$. Depending on the configuration, one or more diodes may be used to covert full-wave AC to DC. Full-wave rectification may be achieved, for instance, by combining two half-wave converters of opposite polarities as in a conventional full-wave rectifier.

A transformer and one or more inductors or capacitors may also be provided as in conventional power supplies to change (e.g., step-down or step-up) and/or to filter the input/output voltage. And a voltage regulator chip may optionally be provided to output rated voltage at a given power level if required for a particular application.

For AC-to-DC power conversion, AC current enters the SWCNT diode as an input. In some instances, the input may be about 1-3 $V_{AC}$ with a frequency of about 1-1000 Hz. The diode converts the AC to DC, by allowing only one phase of the AC to pass through the diode while substantially blocking the other phase. Thus, the diode after receiving an alternating phase (positive and negative) electrical as an input signal outputs a single-phase, continuous DC output signal. Input AC power may not be directly useable by some portable electronics, computers, etc.; however, the output DC power can be used to power such devices, either by connecting the output of the SWCNT diode AC-to-DC converters directly to the device's power supply and/or by storing or charging power in one or more batteries or capacitors for the device.

Utilizing the high forward/reverse current ratio, efficient AC-DC power conversion based on these SWCNT diodes may be realized. Half-wave power conversion efficiency of 20% or more has been demonstrated, for instance. In addition to low power device applications, the simple design and extremely small component size also allows for use in the traditionally Complementary Metal Oxide Semiconductor (CMOS) field of low voltage energy harvesting. This may be advantageous for various devices such as, for example, radio frequency identification (RFID) chips, biomedical implants and devices, and wireless sensors that require the efficient conversion of an induced low voltage AC signal into a useable DC output in a very small package size.

Embodiments of the present invention may be used for commercial electronic circuitry, and power conversion application, such as rectification. Benefits may include: reduced component size (e.g., by three orders of magnitude) and weight, increased power conversion efficiency, lower heat generation, reduced thermal conductivity, higher heat dissipation, simpler device fabrication/construction, and lower manufacturing costs lower overall device costs.

EXAMPLES

The inventors fabricated and tested an array of single-wall carbon nanotube (SWCNT) diodes. FIG. 1 is a schematic of a SWCNT diode 100 which was fabricated and tested by the inventors.

To fabricate the diode 100, a substrate 20 was first deposited with a layer of thermal oxide 30. The substrate 20 was a highly doped (n-type) silicon (Si) substrate which was 15 mm×15 mm, which also serves as a back gate 25. The layer of thermal oxide 30 was silicon dioxide ($SiO_2$) having a thickness of approximately 100 nm.

Next, SWCNTs 40 were grown on the thermal oxide 30. In the array, the SWCNTs had varying channel lengths or gaps. Here, the SWCNTs 40 were grown using a catalytically chemical vapor deposition (CCVD) technique. The CCVD fabrication was performed according the technique disclosed in the publication entitled "Parallel arrays of individually addressable single-walled carbon nanotube field-effect transistors," mentioned above.

Electrodes then were formed at the terminal ends of the SWCNTs 40. Here, electrode pads 50a, 50b were fabricated by photolithographically depositing a 10 nm thick layer of titanium (Ti) followed by a 100 nm layer of gold (Au) onto the deposited Ti layer. The dimension of each electrode pad was 250×250 µm². The electrode pads 50a, 50b serve as source S and drain D separation for the diode 100, respectively.

The substrate was then annealed at 200° C. for 30 minutes in an atmosphere in which a constant flow of nitrogen passed to eliminate any surface oxygen defects. The diodes 100 were connected to a power source 60 which provided an AC power signal for testing. Electrical leads 62, 64 electrically connected the power source 60 to the electrode pads 50a, 50b, respectively. The leads 62, 64 were wires soldered to the pads 50a, 50b.

Figure 2:
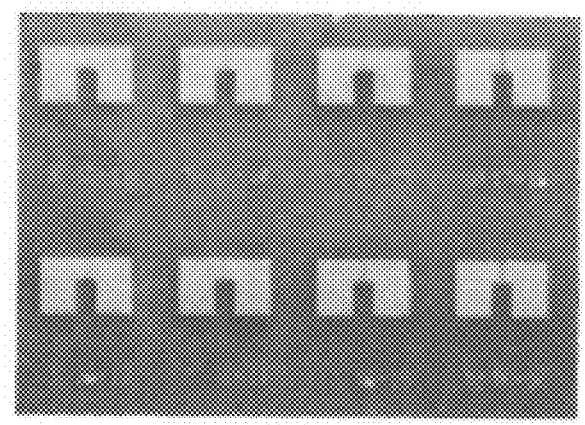
FIG. 2 is a partial SEM image of an array of the SWCNT diodes that were fabricated.

FIG. 2 is a partial SEM image of an array of the SWCNT diodes that were fabricated. A single substrate (chip) with an approximate size of 15 mm×15 mm housed about 135 diodes. These fabricated diodes include four different channel lengths (or gaps) between the electrodes (S and D) of 3 µm, 5 µm, 7 µm and 10 µm, respectively. Each of the diodes in the array was uniquely labeled by its respective channel length, row, and column. In FIG. 2, 8 of 135 diodes that were fabricated are shown and distinctly marked (i.e., etched) with coordinates of: Rows: 16th and 17th; Column: 13th, 14th, 15th, and 16th, respectively.

Scanning electron microscope (SEM: Hitachi S-4700) and atomic force microscope (AFM: Veeco CP-II) instruments were used to locate the bridging carbon nanotubes between the electrodes under ambient conditions and to measure the channel length (gap difference).

Figure 3:
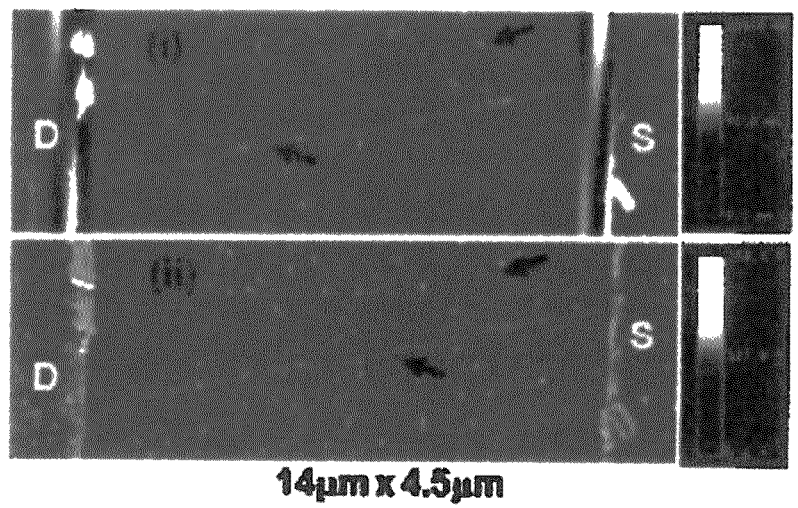
FIG. 3 shows a microscope image of the height and phase images of bundle of SWCNTs in a diode that was fabricated.

FIG. 3 shows a non-contact mode AFM image of the (i) height and (ii) phase images of bundle of SWCNTs connecting a 10 µm gap diode. The SWCNTs, as indicated by the arrows in the figure, are approximately 2 nm in height and 50 nm in width, suggesting bundles rather than isolated nanotubes, of multiple SWCNTs aligned parallel to each other. The electrical properties of the assembled diodes were probed by a semiconductor (SC) analyzer (Keithley-4200) attached to a four-probe micro manipulated cryogenic system (Janis).

Figure 4:
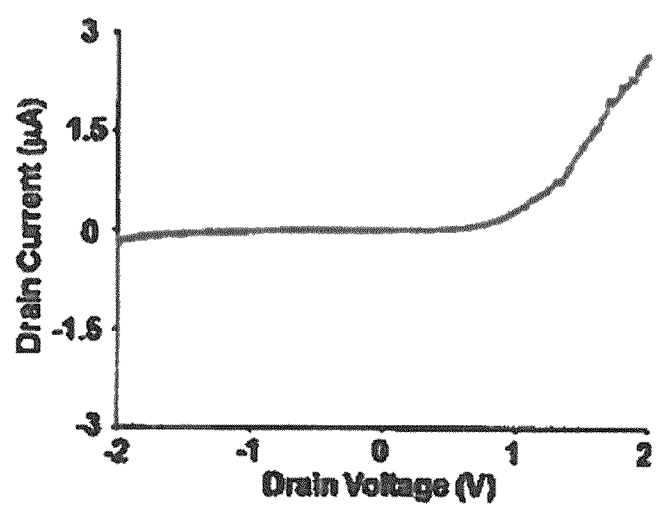
FIG. 4 shows the measured current-voltage (I-V) curve for a SWCNT diode that was tested.

FIG. 4 shows the measured I-V curve for the 10 µm gap diode; the diode labeled "10 17-16" (i.e., the farthest one to the right in the top row of the array in the SEM image of FIG. 2). A significantly high forward/reverse current ($I_{for}/I_{rev}$) ratio can be clearly seen in the measured I-V curve.

Experiments by the inventors demonstrate AC-DC half-wave conversion in the range of 1-1000 Hz by SWCNT diode-based rectifiers, providing a high degree of rectification (i.e., having a forward/reverse current ratio of about $10^5$). This nanoscale diode demonstrated a half-wave power conversion efficiency of 20%, which is comparable to that reported for larger MOSFET diode designs.

Figure 5:
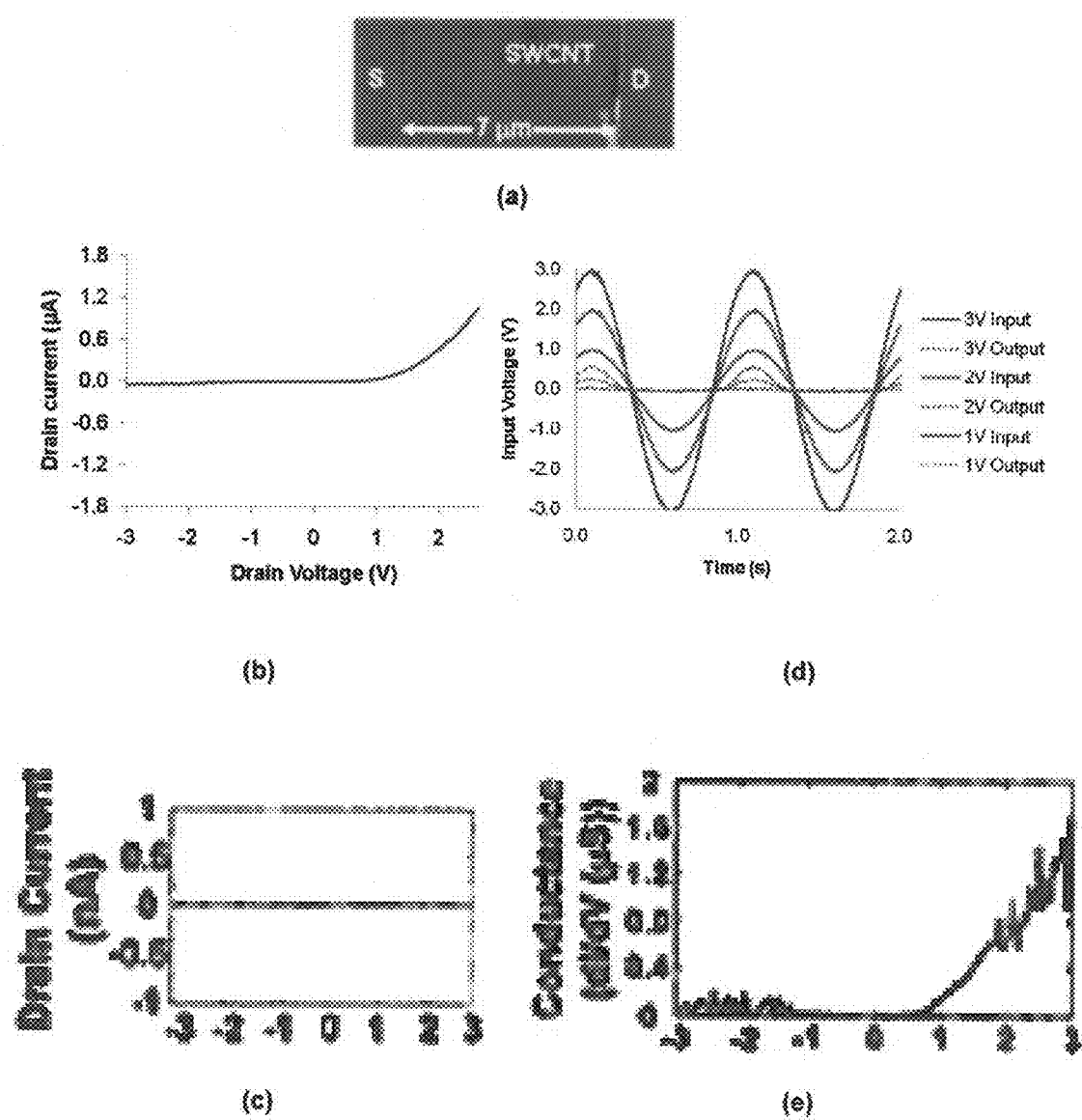
FIG. 5($a$) is a partial image of one SWCNT diode that was tested.

FIG. 5($a$) is a partial AFM image showing a SWCNT diode connecting the two electrodes as tested. This SWCNT diode had a 7 µm channel length or gap between the S and D electrodes.

The AC-to-DC power conversion by the SWCNT diode was determined using a SC analyzer with a four-probe micro manipulator to make contact with the diode source/drain electrode pads. The source electrode pad of the diode was wired to a pulse generator (Agilent 81110) to provide an AC input signal of controlled frequency, amplitude, and waveform. Here, the waveforms were sinusoidal. For lower input frequencies less than 1 Hz, the drain electrode pad of the SWCNT diode was connected to the SC analyzer for measurement of the output signal. The output measurements for higher input frequencies were performed on a high sampling rate oscilloscope (Agilent 54621A, 1 MΩ input resistance).

FIG. 5($b$) shows a I-V curve and corresponding AC-DC half-wave power conversion for a 7 µm channel length SWCNT diode obtained from a two-probe measurement. The diode was tested for voltages of 1-3 $V_{AC}$ at 1 Hz. The SWCNT diodes yield high throughput of current in the forward bias. Here, the forward/reverse current ($I_{for}/I_{rev}$) ratio at +/−2V bias is on the order of $10^5$.

FIG. 5($c$) shows the I-V trace of a blank 7 µm gap in the channel on the substrate without the SWCNTs as a comparison. There is essentially no current output. While most of the diodes with different channel lengths showed rectification behavior, the dependence of rectification on the SC properties of the nanotubes is not entirely understood and may requires additional investigation.

Figure 6:
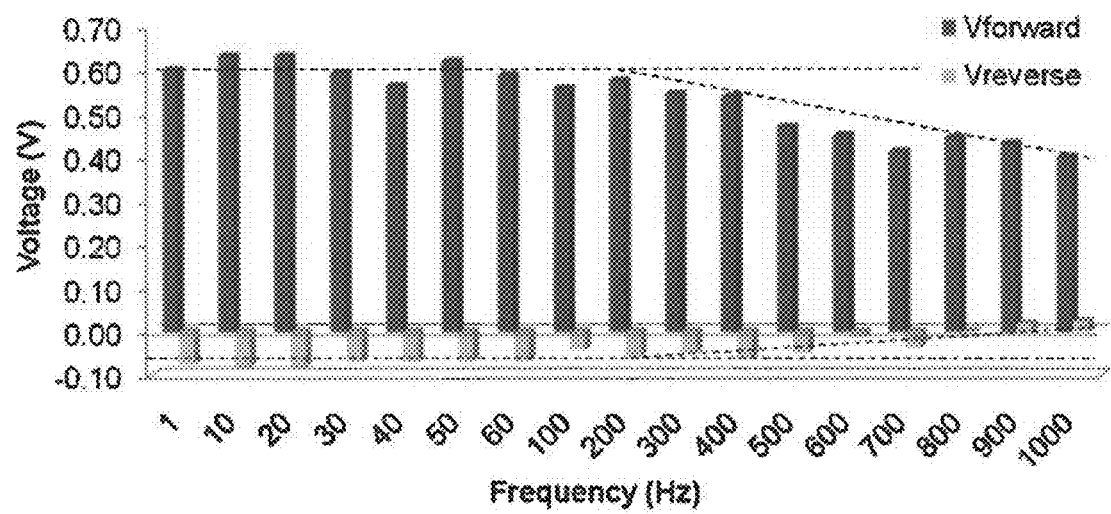
FIG. 6 is graph showing the AC-DC half-wave power conversion characteristics of a SWCNT diode.

FIG. 5($d$) shows that the corresponding experimental AC-to-DC half-wave conversion of 1V, 2V, and 3V at 1 Hz AC input. It can be seen that the negative voltage component of the input signal is nearly completely rectified and only the positive component passes through the SWCNT diode. With the 3V AC input, for example, the diode passed 20.1% of the positive AC-component and only 2.5% of the negative AC. Similar half-wave power conversion characteristics were seen over input frequencies ranging from 1 to 1000 Hz (FIG. 6). As can be seen, similar to the 1 Hz AC input, the output voltage corresponding to the positive AC component is quite large, while there is very little output voltage corresponding to the negative AC component, correlating to the rectification behavior of the SWCNT.

Further correlation to the rectification behavior is shown by the voltage conversion percentage, with a 20.2%, 14.4%, and 3.5% power conversion efficiency (PCE) for the input voltage of 3V, 2V and 1V, respectively (Table I). It is also noted that the DC outputs from the 2V and 3V input voltages are slightly smaller in magnitude than that predicted from the I-V characteristics. It is possible that the higher current loads on the SWCNT junction with metal at elevated voltages results in substantial Joule heating of the diode, leading to an increase in the diode resistance. Previous research has estimated a Joule heating effect upwards of 800K for a current flow of 1.5 μA through a 7 μm CNT channel. At these elevated temperatures the resistance of the tube bundle would increase, ultimately lowering the current output from the diode. The effects of Joule heating at the rectifier junction were further exemplified at increased AC input frequencies.

FIG. 5(e) is a plot of the conductance (dI/dV) of the I-V curve which shows significantly high conduction at the positive bias for a SWCNT diode. The high $I_{for}/I_{rev}$ ratio is also evident.

FIG. 6 is graph showing the AC-DC half-wave power conversion characteristics of a SWCNT diode for input frequencies ranging from 1 to 1000 Hz. As will be appreciated, the output voltage of the diode remained relatively unchanged over the tested range of 1 to 200 Hz. The reverse voltage is negligible compared to the forward voltage. However, in the AC-input frequency range of 200-1000 Hz, a distinct drop in the DC output voltage is seen. Since the input frequencies studied here were too low to contribute greatly to any capacitive or inductive effects, it is possible that the altered DC outputs were the result of Joule heating at the SWCNT junction. A higher frequency at 3V AC input would further elevate the Joule heating effect and decrease the heat dissipation period, resulting in an increased diode junction resistance and lowered current output.

TABLE I

Percentage power conversion at forward and reverse voltages at the frequency of 1 Hz and 60 Hz, respectively.

|  | Output Voltage (V) | | Power Conversion (%) | |
| --- | --- | --- | --- | --- |
|  | 1 Hz | 60 Hz | 1 Hz | 60 Hz |
| 3 $V_F$ | 0.6003 | 0.6069 | 20.01% | 20.23% |
| 2 $V_F$ | 0.2690 | 0.3190 | 13.45% | 15.95% |
| 1 $V_F$ | 0.1069 | 0.0944 | 10.69% | 9.44% |
| 3 $V_R$ | −0.0747 | −0.0681 | 2.49% | 2.27% |
| 2 $V_R$ | −0.0623 | −0.0431 | 3.12% | 2.16% |
| 1 $V_R$ | −0.0619 | −0.0494 | 6.19% | 4.94% |

In the 3V input range, the half-wave PCE of the SWCNT diode is directly comparable to the 20%-25% PCE demonstrated by PMOS and MOSFET diodes. To overcome this low efficiency, conventional CMOS designs employ complex integrated circuitry and active elements to minimize the cross-diode voltage drop, allow for full-wave conversion, and to reduce substrate leakage to realize efficiencies greater than 90%. These same concepts are amenable to the smaller SWCNT diode and designs can be engineered to maximize PCE with a reduced number of components and chip size.

AC-DC half-wave power conversion by SWCNT diodes with minimum components was demonstrated. Advantage is taken of the nearly five-orders of magnitude difference in the magnitude of the current of the diodes between the forward and backward biases. The minimum number of components in the demonstrated rectifier combined with a relatively easy device fabrication process makes it a highly attractive technology for engineering AC-DC power converters for low-power micro- and nano-electronics devices.

Figure 7:
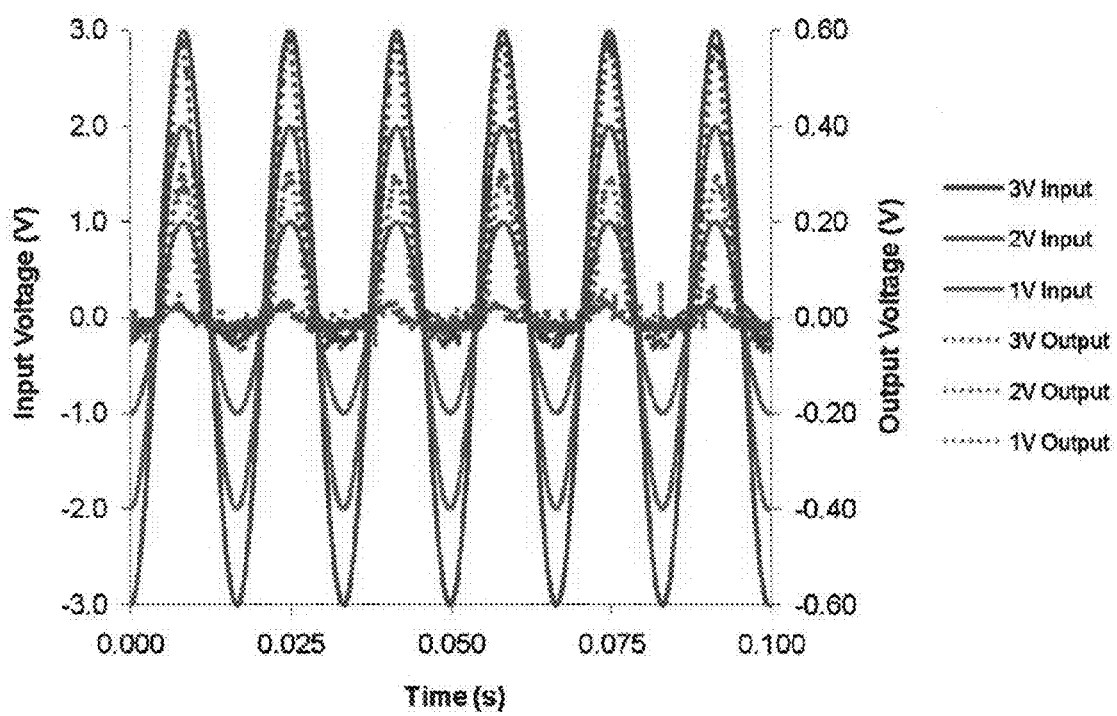
FIG. 7 shows half-wave power conversion of a SWCNT diode under multiple voltage loads.

For many applications, the efficiency of the diode at a 60 Hz AC input signal is important. FIG. 7 shows half-wave power conversion of the SWCNT-FET rectifier device at 60 Hz, under multiple voltage loads of 1-3 $V_{AC}$ at 60 Hz. The same behavior was generally observed for all voltages tested.

The foregoing description, for purpose of explanation, has been described with reference to specific embodiments. However, the illustrative discussions above are not intended to be exhaustive or to limit the invention to the precise forms disclosed. Many modifications and variations are possible in view of the above teachings. The embodiments were chosen and described in order to best explain the principles of the present disclosure and its practical applications, to thereby enable others skilled in the art to best utilize the invention and various embodiments with various modifications as may be suited to the particular use contemplated.

Various elements, devices, modules and circuits are described above in associated with their respective functions. These elements, devices, modules and circuits are considered means for performing their respective functions as described herein.

While the foregoing is directed to embodiments of the present invention, other and further embodiments of the invention may be devised without departing from the basic scope thereof, and the scope thereof is determined by the claims that follow.

The invention claimed is:

1. A diode comprising:
 a plurality of single-wall carbon nanotubes (SWCNT) grouped together in multiple, separate bundles with the SWCNTs being generally aligned parallel to each other in the bundles.

2. The diode of claim 1, wherein a diode property of the SWCNT bundles is the result of structural defects on the SWCNT walls and/or the presence of tubes with mixed chirality in the bundles.

3. The diode of claim 1, wherein the forward/reverse current ratio of the diode is on the order of $10^5$.

4. The diode of claim 1, wherein the diameter of the diode is approximately 1.5-4 nm and the length of the diode is approximately 10-15 μm.

5. The diode of claim 1, further comprising a pair of electrodes, one electrode located at each end of the diode.

6. A rectifier comprising one or more diodes of claim 1.

7. The rectifier of claim 6, wherein the one or more diodes are configured for half-wave, a full-wave or a full-wave bridge rectification.

8. The rectifier of claim 7, wherein the efficiency for half wave power conversion is 20% or more.

9. A method for fabrication a diode comprising:
 growing a plurality of single-wall carbon nanotubes (SWCNT) on a substrate grouped together in multiple, separate bundles with the SWCNTs being generally aligned parallel to each other in the bundles.

10. The method of claim 9, wherein growing the SWCNTs on a substrate comprises: using a catalytically chemical vapor deposition (CCVD) technique.

11. The method of claim 9, further comprising: forming a pair of electrodes, one electrode located at each end of the diode.

12. The method of claim 8, wherein the forming the electrodes comprises:
 depositing a layer of Ti onto the substrate; and
 depositing a layer of Au onto the deposited Ti layer.

13. The method of claim 9, wherein, after the SWCNTs are grown on the substrate, the method further comprises: annealing the substrate.

14. The method of claim 9, wherein growing the SWCNTs comprises growing an array of diodes on the substrate.

15. The method of claim 9, wherein, before growing the SWCNTs, the method further comprises: depositing a thermal insulator or oxide layer onto the substrate.

16. A method of power conversion comprising: supplying an input to the diode of claim 1.

17. The method of claim 16, wherein the input is 1-3 $V_{AC}$ with a frequency of about 1-1000 Hz.

18. The diode of claim 1, wherein the SWCNTs are similarly produced.

19. The method of claim 9, including similarly producing the SWCNTs.

20. The diode of claim 1, wherein there are three to six tube bundles per 100 $\mu m^2$.

* * * * *